United States Patent
Joo et al.

(10) Patent No.: US 9,583,681 B2
(45) Date of Patent: Feb. 28, 2017

(54) LIGHT EMITTER DEVICE PACKAGES, MODULES AND METHODS

(75) Inventors: Sung Chul Joo, Cary, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 102 days.

(21) Appl. No.: 13/367,898

(22) Filed: Feb. 7, 2012

(65) Prior Publication Data

US 2012/0313115 A1    Dec. 13, 2012

Related U.S. Application Data

(60) Provisional application No. 61/440,199, filed on Feb. 7, 2011.

(51) Int. Cl.
| | | |
|---|---|---|
| H01L 27/15 | (2006.01) | |
| H01L 33/48 | (2010.01) | |
| H01L 25/075 | (2006.01) | |
| H01L 33/62 | (2010.01) | |
| H01L 33/64 | (2010.01) | |

(52) U.S. Cl.
CPC .......... *H01L 33/486* (2013.01); *H01L 33/647* (2013.01); *H01L 25/0753* (2013.01); *H01L 33/62* (2013.01); *H01L 33/641* (2013.01); *H01L 2224/48091* (2013.01); *H01L 2933/0033* (2013.01)

(58) Field of Classification Search
CPC ...................................... H01L 33/0004–33/648
USPC .......... 257/79–103, 678, 680, 684, 700–702, 257/707, 711, 723, 725, 729, 731, 778, 257/771, 787–789, E23.158–E23.16
See application file for complete search history.

(56) References Cited

U.S. PATENT DOCUMENTS

| | | | |
|---|---|---|---|
| 4,946,547 A | 8/1990 | Palmour | |
| 5,200,022 A | 4/1993 | Kong | |
| 5,210,051 A | 5/1993 | Carter, Jr. | |
| RE34,861 E | 2/1995 | Davis et al. | |
| 5,393,993 A | 2/1995 | Edmond | |
| 5,523,589 A | 6/1996 | Edmond | |
| 8,058,088 B2 | 11/2011 | Cannon | |
| 2003/0098459 A1* | 5/2003 | Horiuchi et al. | 257/81 |
| 2005/0199900 A1* | 9/2005 | Lin et al. | 257/99 |
| 2006/0186418 A1 | 8/2006 | Edmond | |
| 2006/0246617 A1* | 11/2006 | Lee et al. | 438/26 |
| 2007/0080360 A1* | 4/2007 | Mirsky et al. | 257/99 |
| 2007/0158668 A1 | 7/2007 | Tarsa | |
| 2008/0173884 A1 | 7/2008 | Chitnis | |
| 2008/0179611 A1 | 7/2008 | Chitnis | |

(Continued)

*Primary Examiner* — David Vu
*Assistant Examiner* — Cuong B Nguyen
(74) *Attorney, Agent, or Firm* — Jenkins, Wilson, Taylor & Hunt, P.A.

(57) ABSTRACT

Light emitter device packages, modules and methods are disclosed having a body and a cavity that can be formed from a single substrate of material. The material can be thermally conductive and/or metallic. A light emitter device package can have at least one isolating layer creating at least a first isolated portion of the body and/or first isolated portion of the cavity. The isolating layer can be formed from the same material as the single substrate which forms the package body and cavity, and can be a layer which is thermally and electrically isolated. A light emitter or light emitter device, such as an LED chip can be mounted upon a surface of the cavity and upon at least a portion of the isolating layer.

29 Claims, 4 Drawing Sheets

(56) References Cited

U.S. PATENT DOCUMENTS

| | | |
|---|---|---|
| 2008/0258130 A1 | 10/2008 | Bergmann |
| 2008/0261339 A1* | 10/2008 | Koung et al. .................. 438/27 |
| 2010/0127290 A1* | 5/2010 | Joo et al. ....................... 257/98 |
| 2010/0155763 A1 | 6/2010 | Donofrio |

* cited by examiner

LIGHT EMITTER DEVICE PACKAGES, MODULES AND METHODS

CROSS REFERENCE TO RELATED APPLICATION

This application relates and claims priority to U.S. provisional patent application 61/440,199, filed Feb. 7, 2011, the entire contents of which is hereby incorporated by reference herein.

TECHNICAL FIELD

The subject matter disclosed herein relates generally to packages, modules and methods for light emitter devices. More particularly, the subject matter disclosed herein relates to single substrate packages, modules and methods for light emitter devices, such as light emitting diodes (LEDs) or LED chips.

BACKGROUND

Light emitter devices, such as light emitting diodes (LEDs) or LED chips for example, are often packaged within surface mount device (SMD) housings. These housings are often made of plastic and can be referred to as plastic leaded chip carriers (PLCCs). The housings can also comprise a body formed from a ceramic material. Conventional SMD housings feature an LED chip wirebonded to one or more metal leads. The metal leads of the SMD package serve as a channel for supplying the LED chip with electrical power and, at the same time, may act to draw heat away from the LED chip. Metal leads typically utilize metal portions extending from the package body, thereby increasing the overall footprint and cost to manufacture the package.

Heat is generated by the LED chip when power is applied to the chip to produce light. Some of the heat generated by the LED chip may be dissipated by the plastic or ceramic package body; however, most of the heat is drawn away from the LED chip via the metal components, or other elements of high thermal conductivity, comprising the LED package. Plastic and ceramic housings can be limited in the amount of heat that can be thermally conducted away from the LED chip, and can result in inefficient thermal management. As such, plastic and ceramic housings must rely on additional thermal components such as for example, thermal slugs or heat sinks comprising a thermally conductive material to draw heat away from the LED package. Conventional LED packages which include the heat sink, mounting components (leads), and wirebonded LED chips can all result in decreased package performance. For example, wirebonding can decrease reliability and brightness of a LED package while conventional package bodies have higher thermal resistance, thereby relying on incorporation of additional thermal components. The additional components in addition to the processes required to form the body of the SMD housing results in high manufacturing costs.

Consequently, there remains a need for improved light emitter device packages, modules and methods that overcome or alleviate shortcomings of the prior art light emitter device packages, modules and methods.

SUMMARY

In accordance with this disclosure, light emitter device packages, modules and methods are provided. It is, therefore, an object of the present disclosure to provide light emitter device packages, modules and methods with improved thermal efficiency, decreased cost, and a smaller footprint.

These and other objects of the present disclosure as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1A:
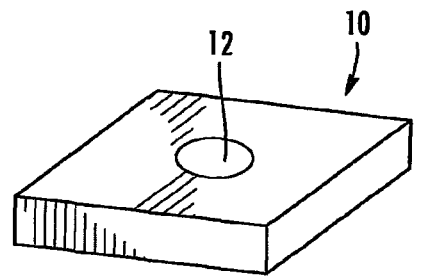
FIGS. 1A and 1B illustrate perspective side views of a light emitting diode (LED) chip according to the present subject matter.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitters or light emitting devices according to embodiments described herein can comprise group III-V nitride (e.g., gallium nitride (GaN)) based light emitting diode (LED) chips or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect, SIC substrates/layers can be 4H polytype silicon carbide substrates/layers. Other Sic candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. Nos. Re. 34,861; 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group Ill elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LED chips disclosed herein comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LEDs or LED chips according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED). Moreover, the growth substrate can be maintained on the LED after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LED chips can be at least partially coated with one or more phosphors. The phosphors can absorb a portion of the LED chip light and emit a different wavelength of light such that the LED device or package emits a combination of light from each of the LED chip and the phosphor. In one embodiment, the LED device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LED chips of different colors, one or more of which can be white emitting.

Figure 1B:
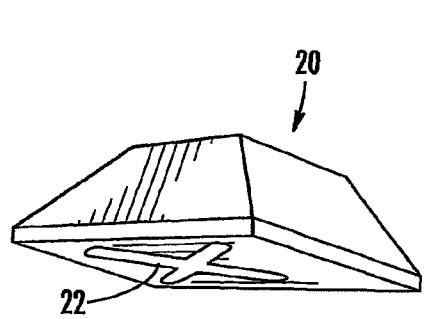

Embodiments of the present subject matter will be described with reference to FIGS. 1-8B. FIGS. 1A and 1B illustrate light emitters or light emitter devices which can comprise for example, light emitting diode (LED) or LED chips 10 and 20 respectively. The LED chips can comprise substrates which can be 4H or 6H n-type silicon carbide. Substrates may also comprise sapphire, bulk gallium nitride (GaN), aluminum nitride (AlN), gallium nitride (GaN), silicon (Si), lithium aluminate, zinc oxide (ZnO), glass, diamond, gallium arsenide, or any other suitable substrate. In one embodiment, LED chip 10 can comprise a conventional chip with at least one bond pad 12 on a top surface of the chip for wirebonding the LED chip 10 to an external electrical element, for example an mounting surface or external electrode. LED chip 10 can comprise any suitable size, shape, and/or number of bond pads 12. As known in the art, conventional LED chips such as LED chip 10 comprise an n-type substrate, for example silicon carbide (SiC) and an active region, not shown. Bond pad 12 can electrically connect to the p-electrode of the p-GaN based layer and can electrically couple the LED chip 10 to an external electrode, for example, a metal lead. The n-electrode of the n-GaN layer can be located on a bottom surface of LED chip 10 for electrically connecting and mounting upon an external submount. External submount can comprise for example, a mounting surface, a heat slug, heat sink, and/or metal lead of an LED package. The connection between LED chip 10 and external submount can form when a metallic epoxy or solder paste bonds the n-electrode of LED chip 10 to the external submount. The n-electrode is on a surface opposite that of bond pad 12. LED chip 10 can attach to external submount using any attachment commonly known in the art. The external submount can also serve as an external electrode. When an electrical current is applied between the external electrodes, light is generated in the active region and directed up and out of the device. However, a substantial amount of the generated light may be transmitted into the substrate and/or partially absorbed by the metallic epoxy. Light may also be absorbed and/or partially blocked by the wire which forms the wirebond.

In accordance with the subject matter disclosed herein and as shown initially in FIG. 1B, LED chip 20 can comprise a chip configured for flip chip bonding. That is, LED chip 20 can be mounted onto an external submount substrate side up, and absent a need for a bond pad. The substrate can comprise an n-type transparent SiC substrate. Light is generated in an active GaN layer of the chip and can be emitted through the transparent substrate. The active GaN layer can comprise an n-type layer and a p-type layer comprising a p-electrode. The p-electrode can comprise a reflecting layer to reflect light generated in the active layer back through the device. Flip chip bonding of SiC-based LED chips can offer improved light extraction and eliminates the need for processing steps such as depositing bond pads and wirebonding. The p-electrode of the active GaN layer can be mounted to an external submount, for example a mounting surface, heat slug, heat sink and/or metal lead by bonding a predefined pattern of conductive die attach material 22 covering at least a portion of the bottom of LED chip 20 to the submount.

Conductive die attach material 22 can comprise a curable die epoxy, solder paste, solder bumps, or any pattern of suitable conductive die attach material known in the art. Conductive die attach material 22 can comprise any suitable size and/or shape of pattern known in the art. Curable die epoxy can be deposited onto the p-electrode of the LED chip 20 using any suitable technique known in the art for example, screen printing, dispensing, layering and laser scribing, photolithography. Solder paste can optionally be used as the die attached material and can comprise any suitable solder epoxy or paste known in the art. For example a metal or alloy such as Au/Sn. Au/Ge, or Pb/Sn mixed together with solvents and/or binders. Solder paste may be applied by screen printing, dispensing, or any suitable technique known in the art. Conductive die attach material 22 can optionally comprise solder bumps, that is, solder without binders or solvents. Solvent bumps can be deposited using any suitable technique known in the art, for example dispensing, electroplating, and/or dipping. LED chips 10 and 20 illustrate devices for example, manufactured and sold by Cree. Inc. of Durham, N.C.

Figure 2A:
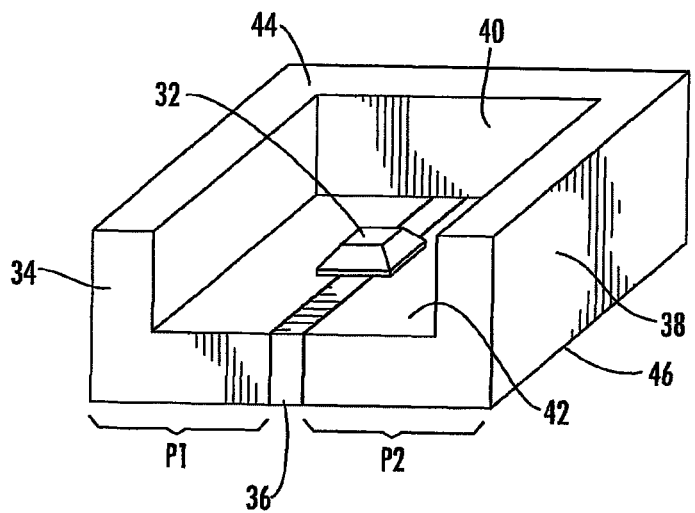
FIGS. 2A and 2B illustrate perspective top views of an embodiment of a LED package according to the present subject matter.
Figure 2B:
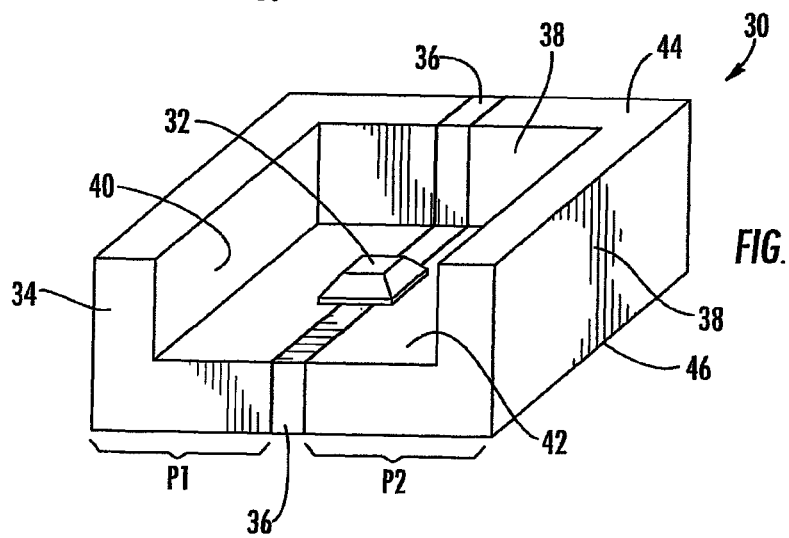

Referring now to FIGS. 2A and 2B, a light emitter device package, or an LED package 30 is shown. LED package 30 can comprise one or more LED chips 32 mounted on a mounting surface 42 of a body 34. LED chips 32 can be mounted directly to mounting surface 42, or in the alternative may be mounted any one of several intervening substrate layers. LED chip 32 can comprise any chip known in the art, for example, comprising not limited to LED chips 10 and 20 illustrated by FIGS. 1A and 1B. Body 34 can comprise a body formed from a single substrate of material as opposed to molding and/or forming a body around various components, for example metal leads and/or additional thermal components. That is, body 34 formed from the single substrate of material can comprise both the electrical and/or thermal components of the body. Body 34 can comprise a thermally conducting and/or metallic body, such as for example aluminum (Al). LED chip 32 can electrically connect with the thermally conductive material forming the body 34 upon mounting.

LED chip 32 can optionally directly electrically connect to a surface of the body 34. Body 34 can comprise a reflector cavity 40 and mounting surface 42 and isolating layer 36. Body 34, reflector cavity, 40, and mounting surface 42 can all be formed from a single substrate of material using processes comprising extruding, pressing, stamping, punching, milling, etching, machining, and/or a combination of processes, or by using any other suitable process known in the art. Isolating layer 36 can then be attached thereto. Alternatively, body 34, reflector cavity, 40, mounting surface 42, and isolating layer 36 can all be formed integrally from a single substrate of material using processes known in the art to form isolating layer 36. For example, in FIGS. 2A and 2B body 34 can be formed by extruding a body from a single substrate of aluminum. The single substrate of material can serve as the electrical and thermal components of the LED package 30. For example, the mounting surface 42 of body 34 can electrically connect with one or more LED chips 32 thereby supplying current which can in turn light the LED chips 32. In one aspect, LED chips 32 can directly connect to mounting surface 42 of body 34. Mounting surface 42 of body 34 can comprise isolating layer 36 which can also serve as a thermal component thereby conducting heat away from LED chip 32 and package 30.

Body 34 can further comprise isolating layer 36 which can be formed integrally as one portion with the single substrate of material that forms body 34 or can be formed separate from body 34 as a separate portion or member of package 30. Isolating layer 36 can comprise any suitable material capable of electrically and thermally isolating portions of the body 34. For example, isolating layer 36 can comprise an insulating or dielectric layer which can be configured to electrically and thermally isolate more than one portion of the body 34. Isolating layer 36 can be formed by using any suitable process known in the art, for example by subjecting at least a portion of body 34 to an anodizing, oxidizing, or a passivation process capable of forming an isolating layer through the body 34. The substrate can undergo one or more of these processes to create isolating layer 36 prior to, upon, or after formation of the body. For example, body 34 can comprise extruded aluminum having isolating layer 36 formed prior to, upon, or after extrusion and isolating layer 36 can comprise anodized aluminum wherein at least a portion of body 34 has been anodized at least partially through the thickness of body 34. In an alternate embodiment, body 34 can be joined to a separately formed isolating layer 36 using any process known in the art. Body 34 can comprise any suitable thermally conducting material known in the art. For example, body 34 can comprise any type of metal capable of being anodized to form an isolating layer 36.

Isolating layer 36 can be configured such that upon formation or attachment to mounting surface 42, one ore more isolated portions P1 and P2 of the body can form. Isolated portions P1 and P2 can be thermally and electrically isolated from each other by isolating layer 36. Isolated portions P1 and P2 of the body 34 can serve as electrical components, for example one portion can comprise an anode and the remaining portion can comprise as cathode to supply the LED chip 32 with electrical current. If LED chip 32 is not thermally isolated by isolating layer 36, then an external source, for example a printed circuit board (PCB) will have to supply the isolation when connecting the LED package 10 components in series. By having body 34 and isolating layer 36 formed from the same substrate of material, manufacturing costs can be decreased by eliminating extraneous components such as separately formed metal leads and thermal components. By joining isolating layer 36 with a body 34 formed from a substrate wherein portions of the body serve as electrical and thermal components can also eliminate manufacturing costs. Also, a footprint of LED package 30 can be minimized by reducing a need for extraneous mounting components extending from lateral sides of the outer walls 38.

Body 34 can comprise a top surface 44, bottom surface 46, and at least one outer wall 38 defining a reflector cavity 40. Body 34 and outer wall 38 can be formed as one piece integrally with isolating layer 36 or separately having an isolating layer 36 attached to body 34. In one aspect, body 34 can comprise at least two, but up to four outer walls 38 forming reflector cavity 40. Reflector cavity 40 can reflect light emitted from the one or more mounted LED chips 32 and can surround mounting surface 42 upon which one or more LED chips 32 can be mounted. FIGS. 2A and 2B illustrate that one or more LED chips 32 can be mounted upon at least a portion of isolating layer 36 which thermally and electrically isolates mounting surface 42 to form at least one isolated portion of the body. For example, isolating layer 36 electrically and thermally insulate isolated portions P1 and P2 of the body 34. The one or more LED chips 32 can also mounted at least partially upon isolated portions P1 and P2. As FIG. 2B further illustrates, isolating layer 36 can be located along at least a portion of mounting surface 42 and can optionally be located along at least a portion of one or more outer walls 38.

Body 34 can further comprise one or more outer walls 38 defining the reflector cavity 40 located orthogonal and/or at any acute or obtuse angle with respect to mounting surface 42 of the reflector cavity 40. That is, the reflector cavity 40 can incline either in towards the mounting surface 42 or away from the mounting surface 42 upon formation of the body 34. Body 34 and reflector cavity 40 can be formed using any suitable method known in the art from any suitable material. As previously mentioned, body 34 can be extruded from one or more pieces of thermally conducting material such as a metal, or body 34 can comprise a reflector cavity 40 formed by punching, milling, machining, pressing, stamping, or etching a substrate. Reflector cavity 40 can also define a cavity for depositing encapsulant. Isolating layer 36 can be formed as a separate portion that is subsequently attached to body 34 or isolating portion 36 can also be formed as an integral portion of body 34.

Figure 3A:
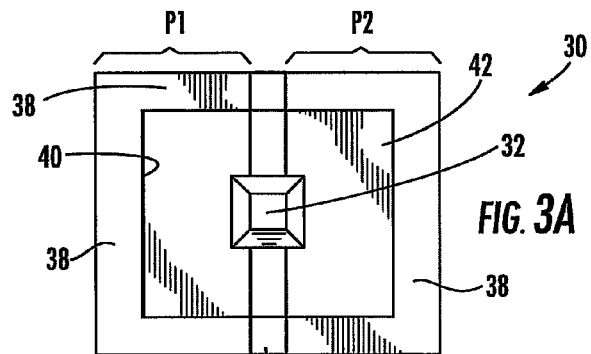
FIG. 3A illustrates a top plan view of an embodiment of a LED package according to the present subject matter.
Figure 3B:
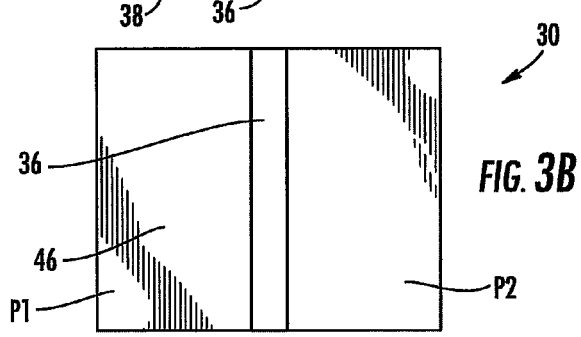
FIG. 3B illustrates a bottom plan view of an embodiment of a LED package according to the present subject matter.

Referring now to FIGS. 3A and 3B, a top view of an embodiment of LED package 30 is illustrated, wherein this aspect package 30 comprises four outer walls 38 which define the reflector cavity 40. Formation of the reflector cavity 40 in this embodiment is likely through punching, stamping, milling, machining, and/or etching to form reflector cavity 40. Aside from LED chip 32. LED package 30 comprising body 34, reflector cavity 40, mounting surface 42, and isolating layer 36 can all be formed from a single substrate of material. In FIG. 3A, one or more LED chips 32 can mount upon mounting surface 42. LED chip 32 can mount upon at least a portion of isolating layer 36 and at least a portion of isolated portions P1 and P2 of the body. Isolating layer 36 can extend at least partially through the thickness of the body 34 to create one or more thermally and electrically isolated portion of the body, for example isolated portions P1 and P2. Isolated portions P1 and P2 can be located adjacent each other and extend up one or more of outer walls 38. In one aspect, isolated portions P1 and P2 can comprise isolating layer 36 disposed therebetween.

FIG. 3B illustrates a bottom view of LED package 30. In this view, bottom surface 46 comprises isolating layer 36 which extends at least partially through the thickness of the body 34 and the mounting surface 42 and can isolate the bottom surface into one or more isolated portions P1 and P2 corresponding to isolated portions on P1 and P2 an opposing surface. Isolating layer 36 can comprise any size, shape, and/or configuration suitable to isolate portions P1 and P2 of the body for isolating one or more LED chips 32. Isolating layer 36 can form integrally as part of the single substrate body 34 or may be formed separately and subsequently attached to body 34. Bottom surface 46 can mount to an external source, for example a printed circuit board (PCB) by using any suitable attachment method known in the art. For example, bottom surface can mount to a PCB using a metallic epoxy or solder technology. Because body 34 comprises a thermally conductive material, it can be unnecessary to incorporate additional components protruding from the body, such as metal leads and/or thermal heat slugs for mounting to the PCB. Bottom views of the remaining embodiments can have essentially the same form and function as that shown by FIG. 3B.

Figure 4:
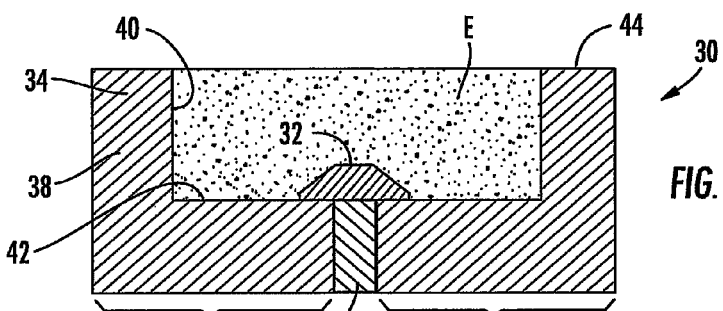
FIG. 4 illustrates a side view of an embodiment of a LED package according to the present subject matter.

Referring now to FIG. 4, LED package 30 can comprise a body 34 having more than one outer wall 38 defining a reflector cavity 40. One or more LED chips 32 can be disposed within reflector cavity 40 and mounted on mounting surface 42 of body 34. Reflector cavity 40 can be filled to any suitable level with an encapsulant E. In this embodiment, encapsulant E is filled such that it is substantially flush with the top surface 44 of the LED package 30. Encapsulant E can optionally contain lumiphors or phosphors, such as yttrium aluminum garnet (YAG) for obtaining light output having a desired wavelength spectrum. As FIG. 4 illustrates, LED package 30 comprising body 34 and isolating layer 36 can be formed from a single substrate of material. Optionally, body 34 can be formed from a single substrate of material and an isolating layer 36 can form separately. FIG. 4 illustrates an embodiment wherein isolating layer 36 can form a distinct layer of body 34 by subjecting body 34 to a process capable of forming a thermally and electrically insulating material, while remaining an integral piece of body 34. For example, body 34 comprising reflector cavity 44 and mounting surface 42 can comprise a single substrate of aluminum while isolating layer 36 can comprise anodized aluminum formed by anodizing the single substrate of aluminum before or after formation of the reflector cavity 44. Formation of LED package 30 is not necessarily limited to aluminum, however, as LED package 30 can, as noted previously, comprise any suitable material known in the art, for example a thermally conductive material and/or metal.

Figure 5:
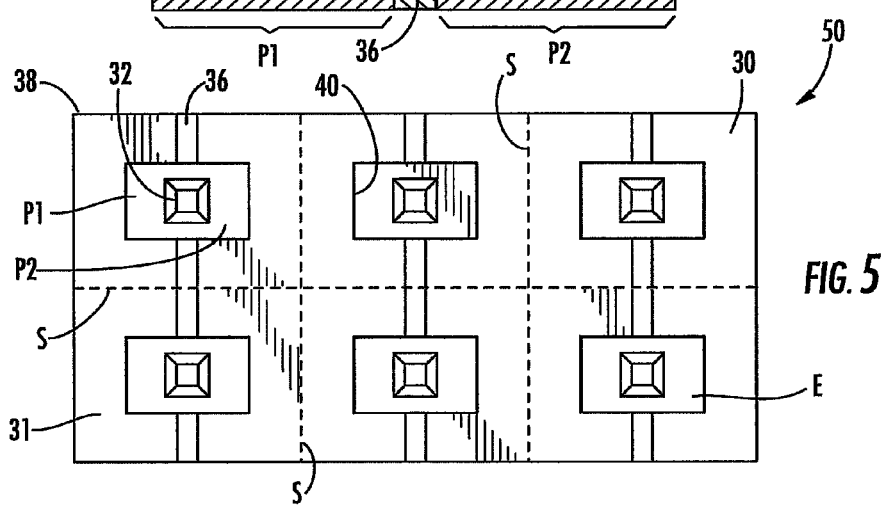
FIG. 5 illustrates a top plan view of an embodiment of a LED package panel array according to the present subject matter.

FIG. 5 illustrates a panel array 50 of LED packages which can be formed from a single substrate of material, for example using processes comprising extruding, pressing, stamping, punching, milling, etching, machining, and/or a combination of these or any other suitable processes known in the art. The material used can comprise a thermally conductive and/or metallic material. This view illustrates an array 50 comprising a body which can be singulated into individual LED packages 30, for example by sawing, dicing, breaking, shearing, or otherwise separating LED packages 30 along lines S. In this view, encapsulant E is disposed within respective reflector cavities 40 and can be leveled off to a level that is substantially flush with a top surface 44 of the individual LED packages 30 (See FIG. 4). If encapsulant E contains a phosphor, which can be yellowish in color, then isolating layer 36 which is located along a mounting surface 42 may not be visible. However, isolating layer 36 can be seen if it is located along and at least partially through outer walls 38 of body 34. Isolating layer 36 can be formed integrally as one piece of the single substrate forming array 50 or can be formed separately and attach to either array 50 or LED packages 30 upon singulation.

In one aspect, at least a portion of LED chip 32 can be mounted upon or attached to a portion of isolating layer 36 which forms electrically and thermally isolated portions P1 and P2 of the mounting surface (FIG. 4) and/or body 34. LED chip 32 can additionally mount upon at least a portion of one or more isolated portions P1 and P2 of the mounting surface 42. Array 50 of LED packages 30 can comprise a single body 31 formed from a single substrate of material prior to singulation into individual LED packages 30. The single substrate of material forming array 50, and thereby individual LED packages 30, can comprise both electrical and thermal components necessary to supply one or more LED chips 32 with electrical current as well as dissipating heat from LED packages 30. That is, electrical and thermal components need not be manufactured separately and embedded in package 30. Array 50 of LED packages can comprise any configuration, that is, individual LED packages 30 can be located along a same axis and plane, or along different axes and planes. Singulation can occur along orthogonal lines S or can comprise lines S located along any acute or obtuse angle with respect to each other.

Figure 6A:
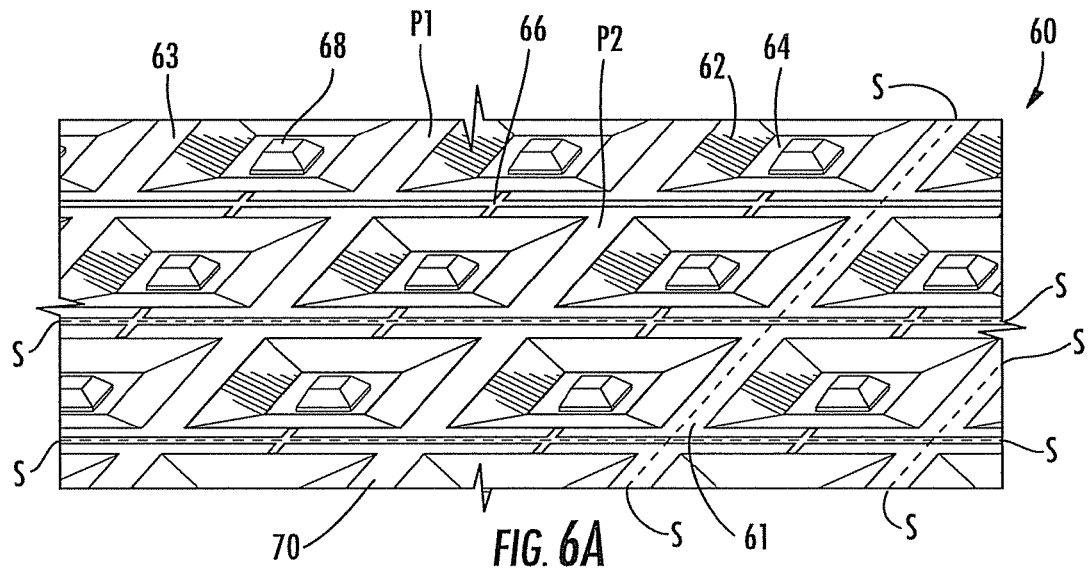
FIGS. 6A and 6B illustrate atop perspective view of an embodiment of a LED package panel array according to the present subject matter.
Figure 6B:
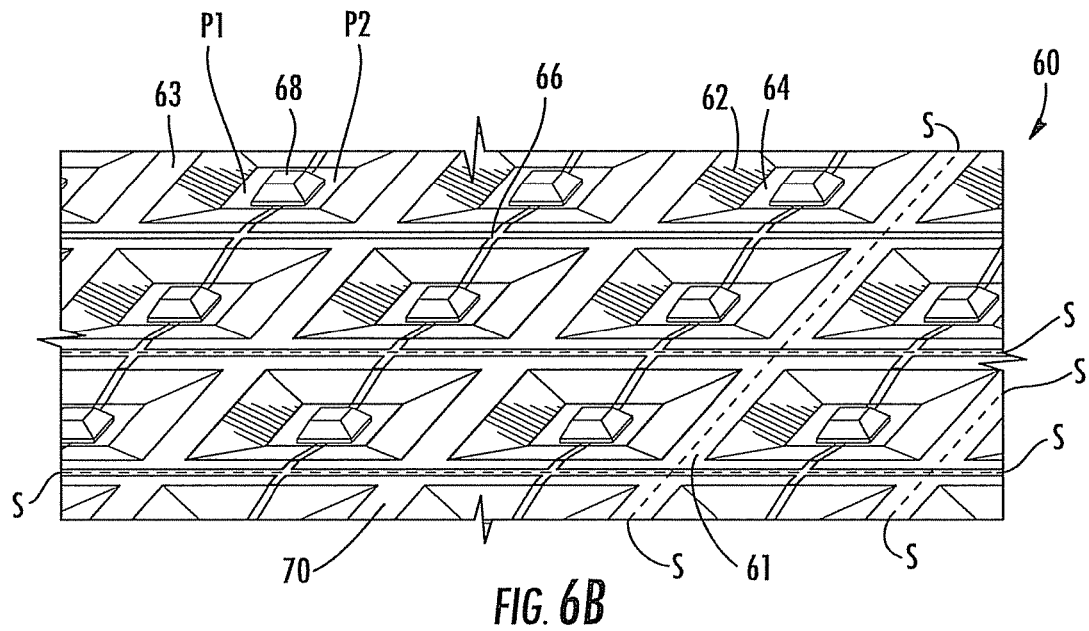

FIGS. 6A and 6B illustrate a panel array 60 of LED packages and can comprise a panel array body 70 formed from a single substrate of material similar in form and function to the bodies previously described. For example, body 70 can comprise a single substrate of material which can comprise a thermally conductive and/or metallic material and is capable of forming one or more isolated portions P1 and P2 within at least a portion of the body 70 of the panel array. One or more LED chips 68 can electrically connect with the thermally conductive material which forms the body 34 upon mounting. For example, one or more LED chips 68 can be disposed within a reflector cavity 62 and mounted on a mounting surface 64 of body 70. LED chips 68 can be mounted directly to mounting surface 64, or in the alternative may be mounted any one of several intervening substrate layers. Walls of reflector cavity 62 can be configured such that reflector cavity 62 inclines with respect to mounting surface 64 upon which one or more LED chips 68 may be mounted. Body 70 comprises a mounting surface upon which LED chips 68 can optionally be directly mounted. Array 60 can comprise one or more isolating layers 66 which can comprise a layer of the single substrate material forming LED packages 61 and panel array 60.

Isolating layers 66 can form when body 70 of panel array 60 is subjected to an anodizing, oxidizing, or passivation process which forms a material which is thermally and electrically insulating. Alternatively, isolating layers 66 can form separately from the single substrate of material forming the body 70 of the panel array. Isolating layer 66 can then attach to body 70 and/or individual LED packages 61. Isolating layers 66 as seen in FIGS. 6A and 6B, and can be located in at least a portion of body 70 and can optionally be located in at least a portion of the mounting surface 64 and reflector cavity 62 as illustrated by FIG. 6B. FIG. 6B illustrates that at least a portion of LED chip 68 can be mounted upon at least a portion of isolating layer 66. As FIG. 6B also illustrates, at least a portion of LED chip 68 can mount upon one or more isolated portions P1 and P2 of mounting surface 64 which form on either side adjacent isolating layer 66. Isolating layer 66 can be disposed between two isolated portions P1 and P2 of the mounting surface 64 and body 70. Notably, LED packages 61 and panel arrays 80 comprising body 70, reflector cavity 62, mounting surface 64, and isolating layer 66 can all be formed from a single substrate of material. Optionally, LED packages 61 and panel arrays 80 comprising body 70, reflector cavity 62, and mounting surface 64 can comprise a single substrate of material wherein isolating layer 66 can be comprise an integral and/or separate member formed via a separate processing step. If formed as a separate member, isolating layer 66 can then attach and/or mount to a portion of body 70, reflector cavity 62, and/or mounting surface 64. In one aspect, LED packages 61 and panel arrays 80 comprising body 70, reflector cavity 62, mounting surface 64, and isolating layer 66 can be integrally formed from a single substrate of thermally conducting material such as aluminum. The isolating layer 66 can then become anodized via an anodization step to form a thermally and electrically insulating layer comprising anodized aluminum.

Encapsulant E (not shown) can optionally be dispensed into respective reflecting cavities 62 and leveled off substantially flush with a top surface 63 prior to singulation into individual light emitter device packages, for example LED package 61 can form at an intersection of singulation lines S. Encapsulant E can optionally be dispensed into respective reflector cavities 62 upon singulation and subsequently leveled off substantially flush with a top surface 63. In this embodiment, packages can be singulated from array 60 by sawing, dicing, breaking, shearing, or otherwise separating one or more LED packages along lines S. The array of LED packages can comprise any configuration, that is individual LED packages can be located along a same axis and plane, or along different axes and planes. Singulation can occur along orthogonal lines S or can comprise lines S located along any acute or obtuse angle with respect to each other.

Figure 7:
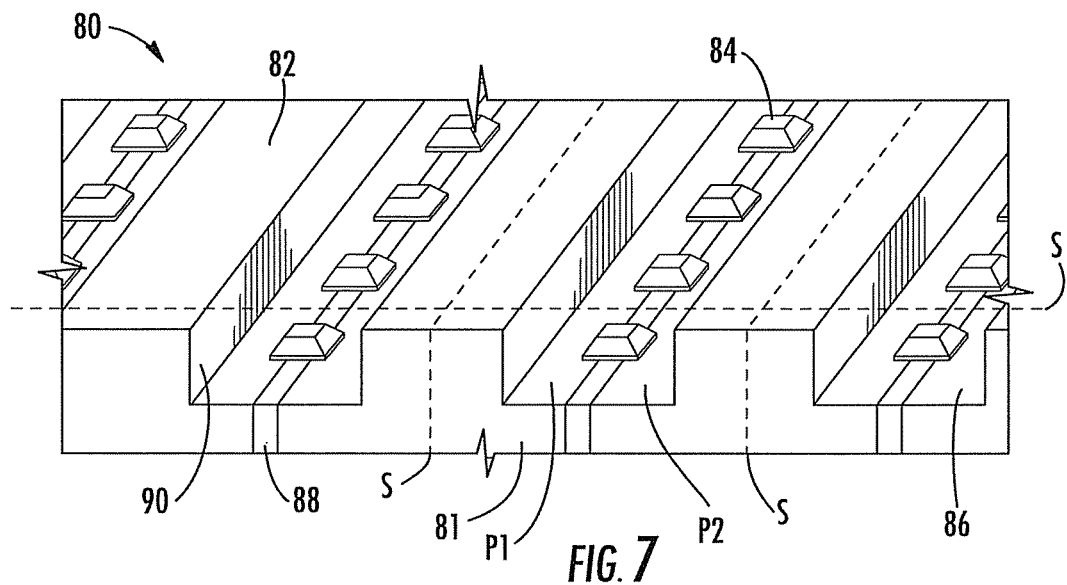
FIG. 7 illustrates a top perspective view of an embodiment of a LED package panel array according to the present subject matter.

FIG. 7 illustrates another embodiment of a panel array 80 of light emitter device packages, or LED packages 81 formed from a single substrate of material similar in form and function with respect to other packages as described above. That is, LED package 81 and panel array 80 comprising a body 82, reflector cavity 90, mounting surface 86, and isolating layer 88 can all be formed from a single substrate of material. Optionally, LED packages 80 and panel arrays 80 comprising body 82, reflector cavity 90, and mounting surface 86 can comprise a single substrate of material wherein isolating layer 88 can be formed separately. Forming body 82 comprising the reflector cavity 90 and mounting surface 86 from a single substrate of material creates a package wherein the single substrate comprises both the electrical and thermal components required for LED packages 81. Body 82 comprises a thermally conductive material. One or more LED chips LED chip 84 can electrically connect with the thermally conductive material forming the body 82. Formation of packages 81 from a single substrate of material eliminates the need to manufacture separate thermal and electrical components and then embed the components in a separately formed body. If formed separately, isolating layer 88 can then attach and/or mount to a portion of body 82, reflector cavity 90, and/or mounting surface 86. Isolating layer 88 can form integrally as one portion with the single substrate of material when the substrate of material is subjected to a process which creates a layer that is thermally and electrically insulating, for example anodizing the substrate to form isolating layer 88. Isolating layer 88 can also be manufactured separately from the single substrate of material by any process known in the art. Isolating layer can isolate at least two isolated portions P1 and P2 of the mounting surface 86 and of the body 82. Isolated portions P1 and P2 are thermally and electrically isolated by isolating layer 88 which can form therebetween.

Panel array 80 can comprise a single substrate of any thermally conductive and/or metallic material known in the art, for example a metallic material such as aluminum. The thermally conductive and/or metallic material will serve as the electrical and thermal components of the LED packages 81. In this embodiment, body 82 of array 80 can be extruded or otherwise formed using any suitable process known in the art. Singulation into individual LED packages, for example LED package 81 can occur along lines S which can be orthogonal or lines S located along any acute or obtuse angle with respect to each other. An array of LED chips 84 can mount upon mounting surface 86 of the body 82 and comprise any configuration known in the art, for example, LED chips 84 can be located along a same axis and plane, or along different axes and planes. LED chips 84 can be mounted directly to mounting surface 86, or in the alternative may be mounted any one of several intervening substrate layers. Mounting surface 86 can comprise one or more isolating layers 88 extending at least partially through the thickness of the mounting surface. Isolating layer 88 can comprise a layer of the single substrate material forming LED packages 81 formed using an anodizing, oxidizing, or passivation process which forms a material which is thermally and electrically insulating. Alternatively, isolating layer 88 can be formed separately from the single substrate forming the body 82. In one aspect, isolating layer 88 can comprise anodized aluminum which is electrically and thermally insulating.

Isolating layer 88 can be configured in any size and/or shape to isolate one or more portions P1 and P2 of the mounting surface 86. One or more LED chips 84 can be disposed within reflector cavity 90 and mounted on mounting surface 86 of body 82. One or more LED chips 84 can mount on at least a portion of isolating layer 88. LED chips 84 can also mount upon at least a portion of one or more isolated portions P1 and P2 of the mounting surface 86 formed adjacent isolating layer 88. That is, isolating layer 88 can be disposed between isolated portions of the mounting surface 86 and body 82. In this embodiment, encapsulant E (not shown) can be dispensed into reflector cavity 90 prior to singulation. Reflector cavity 90 can be inclined at an obtuse or acute angle and/or orthogonal to mounting surface 86. Encapsulant E can be filled to any desirable level within reflector cavity 90, for example substantially flush with a top surface of body 82. One or more packages can then be singulated from array 80 by sawing, dicing, breaking, shearing, or otherwise separating one or more LED packages along one or more lines S. Singulation can occur along orthogonal lines S or can comprise lines S located along any acute or obtuse angle with respect to each other. Upon singulation, individual LED packages 81 will be formed having more than one, for example two walls of reflector cavity 92.

Figure 8A:
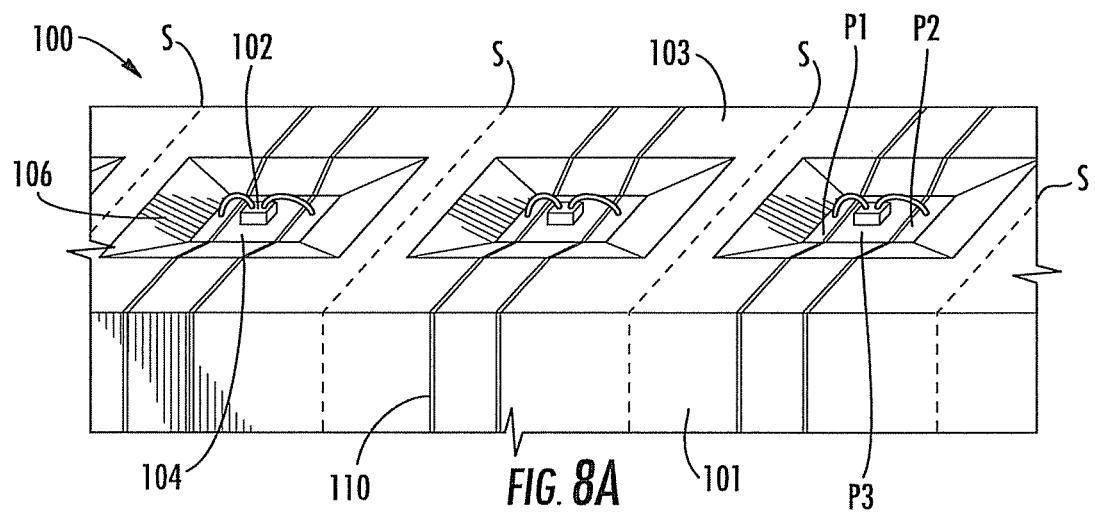
FIGS. 8A and 8B illustrate perspective top views of embodiments of a LED package panel array according to the present subject matter.
Figure 8B:
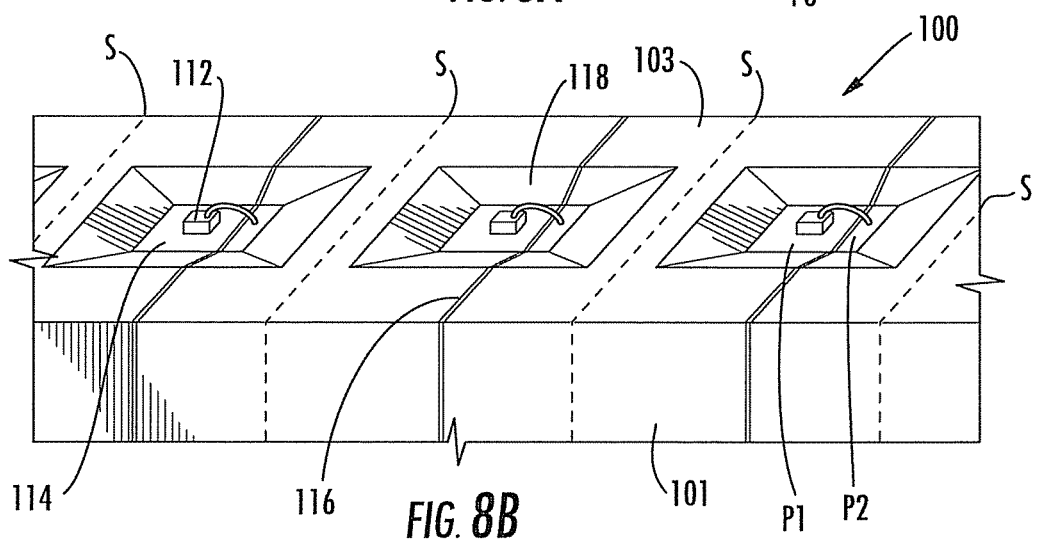

Referring now to FIGS. 8A and 8B, a panel array 100 of light emitter device packages such as LED packages 101 can be formed wherein LED chips 102 and 112 are attached and wirebonded to mounting surfaces 104 and 114, respectively. For example, LED chips 102 and 112 can comprise a top surface having a bond pad wherein chips 102 and 112 can electrically connect to a first isolated portion P1 of a mounting surface of the cavity by wirebonding, and the first portion P1 is thermally and electrically isolated from at least a second portion P2 of the mounting surface of the cavity. The at least first and second portions P2 and P2 can separate by one or more isolation layers 110 and 116. Referring to FIGS. 8A and 8B, one or more LED chips 102 and 112 can be disposed within reflector cavity 106 and 116, respectively, and mounted on respective mounting surface 104 and 114 of body 103. LED chips 102 and 112 can be mounted directly to mounting surfaces 104 and 114, or in the alternative may be mounted any one of several intervening substrate layers. One or more outer walls of LED packages 101 can define the reflective cavities 106 and 116. In one aspect, LED chip 102 can comprise more than one bond pad. In this situation there can be multiple isolated portions, for example, isolated portions P1, P2, and P3. LED chip 102 can be mounted on at least one isolated portion P3 and through wirebonding can electrically connect with one or more isolated portions, for example, P1 and P2.

Panel array 100 comprises a body 103 comprising a single substrate of any thermally conductive material known in the art, for example a metal comprising aluminum. The single substrate of material can serve as the electrical and thermal components of the LED packages 81. That is, one or more LED chips 102 and 112 can electrically connect to the body 103 comprising the thermally conductive material when mounted to the body 103. Aside from the LED chips 102, panel array 100 comprising individual LED packages 101 comprising body 103, reflector cavity 106, mounting surface 104, and one or more isolating layers 110 can all be formed from a single substrate of material. Reflector cavity 106 can incline at an obtuse or acute angle and/or can be orthogonal to mounting surface 104.

In FIG. 8A, LED chips 102 can comprise more than one bond pad. LED chips 102 can be wirebonded to one or more thermally and electrically isolated portions P1 and P2 of the mounting surface 104 adjacent one or more isolating layers 110. That is, isolating layer 110 can be disposed between at least two isolated portions P1, P2, and/or P3 of the mounting surface 104 and body. Panel array 100 can comprise at least one isolating layer 110 which can thermally and electrically form isolated portions P1, P2, and P3 of the LED packages 101. Isolating layers 110 can comprise a layer of the single substrate material forming LED packages 101. Isolating layers 110 can separate and electrically and thermally isolate at least one portion of the mounting surface 104 and resultant LED package 101. Isolating layer 110 can be formed by subjecting the single substrate of material to an anodizing, oxidizing, or passivation process to create a material, such as a dielectric material which is electrically and thermally insulating. For example, isolating layers 110 can comprise anodized aluminum which is electrically and thermally insulating and a layer can be formed on a substrate, before or after formation of the reflector cavity 106. Optionally, LED packages 101 and panel arrays 100 comprising body 103, reflector cavity 106, and mounting surface 104 can comprise a single substrate of material wherein isolating layer 110 can be formed separately. If formed separately, isolating layer 110 can then attach and/or mount to a portion of body 103, reflector cavity 106, and/or mounting surface 104.

Isolating layer 110 can be located at least partially through the thickness of the body 101 as well as along the mounting surface 104 and optionally along one or more walls of the reflector cavity 106. One of isolated portions P1, P2, and P3 of the mounting surface 104 can serve as anode and one as cathode for supplying current to the LED chip 102. Isolated portions can also dissipate heat generated by LED chip 102. Encapsulant E (not shown) can be dispensed within reflector cavity 106 either prior to or after singulation of the array 100 into individual LED packages along lines S. Encapsulant E can be dispensed to any suitable level, for example substantially flush with a top surface of the reflector cavity 106.

FIG. 8B illustrates an embodiment similar in form and function to FIG. 8A wherein LED chip 112 comprises at least one bond pad on an upper surface, similar to that shown in FIG. 1A. At least one isolating layer 116 isolates portions P1 and P2 of a mounting surface 114 and/or walls of a reflector cavity 118 wherein LED chip 112 is mounted. Isolating layer 116 can be formed integrally as one integral portion of body 103 or as a separate portion subsequently attached thereto as previously described. Alternatively, isolating layer 116 can comprise a layer formed integrally with the single substrate material forming LED packages 101. In one aspect, isolating layer 116 can be formed by subjecting the single substrate of material to an anodizing, oxidizing, or passivation process to create a material, such as a dielectric material which is electrically and thermally insulating. For example, isolating layer 116 can comprise anodized aluminum which is electrically and thermally insulating. Isolating layer 116 can isolate at least two portions P1 and P2 of the body, for example, mounting surface 114 and/or walls of the reflector cavity 118. One of the isolated portions P1 and P2 can serve as anode and the other as cathode for supplying current to the wirebonded LED chip 112. Isolated portions P1 and P2 can also dissipate heat generated by LED chip 112. Encapsulant E (not shown) can be dispensed within reflector cavity 118 prior to or after singulation of the array 100 into individual LED packages 101 along lines S. Encapsulant E can be dispensed to any suitable level, for example substantially flush with a top surface of the reflector cavity 118.

Embodiments of the present disclosure shown in the drawings and described above are exemplary of numerous embodiments that can be made within the scope of the appended claims. It is contemplated that the configurations of LED packages such as those disclosed herein can comprise numerous configurations other than those specifically disclosed.

What is claimed is:

1. A light emitter device package comprising:
    a body having a cavity;
    at least one light emitter device disposed in the cavity and mounted to the body, wherein the body comprises an anode, a cathode, and an insulator disposed therebetween, wherein the at least one light emitter is directly attached to each of the anode, the cathode, and the insulator, and wherein the insulator inhibits electrical communications therethrough;
    wherein a depth of the cavity is greater than a thickness of a lower portion of the body disposed below the at least one light emitter device, and wherein the insulator comprises a layer having a substantially uniform thickness extending within the lower portion of the body; and
    wherein the body, including the anode, the cathode, and the insulator, is formed from a single substrate of material.

2. The light emitter device package according to claim 1, wherein the at least one light emitter device comprises at least one light emitting diode (LED) chip.

3. The light emitter device package according to claim 1, wherein the single substrate of material comprises a thermally conductive material.

4. The light emitter device package according to claim 1, wherein the insulator is an isolating layer of the single substrate of material.

5. The light emitter device package according to claim 4, wherein the single substrate of material comprises aluminum.

6. The light emitter device package according to claim 5, wherein the isolating layer comprises anodized aluminum.

7. The light emitter device package according to claim 2, wherein the LED chip is configured to emit blue light.

8. A light emitter device package comprising:
    a body having at least one cavity, the cavity comprising an isolating layer disposed between a first electrically conductive portion of the cavity and a second electrically conductive portion of the cavity, wherein the isolating layer is devoid of electrically conductive material;
    at least one light emitter chip disposed within the cavity, wherein a bottom surface of the at least one light emitter chip comprises a first electrical contact and a second electrical contact, wherein the first electrical contact is directly attached to the first electrically conductive portion of the cavity, wherein the second electrical contact is directly attached to the second electrically conductive portion of the cavity, and wherein a portion of the at least one light emitter chip that is disposed between the first electrical contact and the second electrical contact is directly attached to the isolating layer;
    wherein the bottom surface of the at least one light emitter chip is centrally disposed over the isolating layer, such that equal portions of the bottom surface of the at least one light emitter chip directly contact each of the first and second electrically conductive portions of the cavity; and
    wherein the first electrically conductive portion and the second electrically conductive portion are thermally and electrically isolated by the isolating layer.

9. The light emitter device package according to claim 8, wherein the isolating layer is anodized aluminum.

10. The light emitter device package according to claim 8, wherein the at least one light emitter chip comprises a light emitting diode (LED) chip mounted to at least a portion of the isolating layer using flip chip bonding.

11. The light emitter device package according to claim 8, wherein the body comprises more than one cavity to form a panel array.

12. The light emitter device package according to claim 8, wherein the body and the cavity are formed from a single substrate of material.

13. The light emitter device package according to claim 12, wherein the single substrate of material is a thermally conductive material.

14. The light emitter device package according to claim 12, wherein the single substrate of material is aluminum.

15. The light emitter device package according to claim 13, wherein the isolating layer comprises anodized aluminum.

16. The light emitter device package according to claim 8, wherein the at least one light emitter chip is configured to emit primarily blue light.

17. A method of forming a light emitting diode (LED) package from a single substrate of material, the method comprising:
   providing the single substrate of material;
   forming at least one cavity within the single substrate of material, wherein a depth of the cavity is greater than a thickness of a lower portion of the single substrate of material disposed below the cavity;
   anodizing a portion of the single substrate of material to electrically isolate a first half of the cavity from a second half of the cavity, wherein the first half of the cavity forms an anode, the second half of the cavity forms a cathode, and an anodized portion of the single substrate of material is centrally disposed between the anode and the cathode for forming an insulator, wherein the insulator comprises a layer having a substantially uniform thickness extending within the lower portion of the single substrate of material, wherein the insulator inhibits electrical communications therethrough, and wherein the first half of the cavity, the second half of the cavity, and the insulator are each formed from the single substrate of material; and
   mounting an LED chip directly to each of the anode, the cathode, and the insulator, such that equal portions of a bottom surface of the LED chip are in direct contact with each of the anode and the cathode.

18. The method according to claim 17, wherein forming the body and cavity comprises a step selected from the group consisting of extruding, pressing, stamping, punching, milling, etching, and machining.

19. The method according to claim 17, wherein mounting the LED chip comprises using flip chip bonding.

20. The method according to claim 17, further comprising singulating the LED package from a panel array of LED packages.

21. The method according to claim 20, wherein singulating the LED packages comprises a step selected from the group consisting of sawing, dicing, breaking, and shearing.

22. A light emitter device package comprising:
   a body comprising a thermally conductive material, the body defining a cavity having a depth greater than a lower portion of the body disposed below the cavity, wherein the body comprises a thermally conductive electrical insulator of a substantially uniform thickness disposed between a first portion of the body and a second portion of the body;
   at least one light emitter device disposed within the cavity, wherein the at least one light emitter device is directly attached to the thermally conductive electrical insulator, and wherein the thermally conductive electrical insulator is devoid of electrically conductive material;
   wherein the light emitter device is electrically connected to each of the first and second portions of the body; and
   wherein the first portion of the body comprises an anode, the second portion of the body comprises a cathode, and wherein the anode, the cathode, and the thermally conductive electrical insulator are formed from a single substrate of material.

23. The light emitter device package according to claim 22, wherein the at least one light emitter device comprises at least one light emitting diode (LED) chip.

24. The light emitter device package according to claim 23, wherein the LED chip is mounted upon a mounting surface of the body.

25. The light emitter device package according to claim 22, wherein the body and cavity are formed integrally from a single substrate of thermally conductive material.

26. The light emitter device package according to claim 22, wherein the electrical insulator comprises aluminum oxide.

27. The light emitter device package according to claim 22, wherein the at least one light emitter device is configured to emit blue light.

28. The light emitter device package according to claim 22, wherein the light emitter device comprises an LED chip mounted to at least a portion of the electrical insulator via flip chip bonding.

29. The light emitter device package according to claim 22, wherein the body comprises aluminum.

* * * * *